US006790755B2

(12) United States Patent
Jeon (10) Patent No.: US 6,790,755 B2
(45) Date of Patent: Sep. 14, 2004

(54) PREPARATION OF STACK HIGH-K GATE DIELECTRICS WITH NITRIDED LAYER

(75) Inventor: Joong Jeon, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 73 days.

(21) Appl. No.: 10/034,163

(22) Filed: Dec. 27, 2001

(65) Prior Publication Data

US 2003/0194853 A1 Oct. 16, 2003

(51) Int. Cl.$^7$ ............................................. H01L 21/336
(52) U.S. Cl. ..................... 438/591; 438/287; 438/763; 257/E21.639
(58) Field of Search ................................ 438/216, 591, 438/240, 217, 287, 762, 763, 775, 761, FOR 202, FOR 402; 257/E21.639

(56) References Cited

U.S. PATENT DOCUMENTS

| | | | |
|---|---|---|---|
| 5,434,109 A | 7/1995 | Geissler et al. ............. 437/239 |
| 5,688,724 A | * 11/1997 | Yoon et al. .................. 438/778 |
| 6,013,553 A | 1/2000 | Wallace et al. ............. 438/287 |
| 6,020,024 A | 2/2000 | Maiti et al. ............... 427/248.1 |
| 6,020,243 A | 2/2000 | Wallace et al. ............. 438/287 |
| 6,114,258 A | 9/2000 | Miner et al. ................ 438/787 |
| 6,163,049 A | 12/2000 | Bui ............................ 257/321 |
| 6,168,958 B1 | 1/2001 | Gardner et al. ................ 438/3 |
| 6,184,155 B1 | 2/2001 | Yu et al. ..................... 438/763 |
| 6,210,999 B1 | 4/2001 | Gardner et al. ............. 438/183 |
| 6,251,761 B1 | 6/2001 | Rodder et al. ............. 438/591 |
| 6,258,675 B1 | 7/2001 | Gardner et al. ............. 438/287 |
| 6,265,268 B1 | 7/2001 | Halliyal et al. ............. 438/261 |
| 6,291,866 B1 | 9/2001 | Wallace et al. ............. 257/410 |
| 6,291,867 B1 | 9/2001 | Wallace et al. ............. 257/410 |
| 6,297,107 B1 | 10/2001 | Paton et al. ................ 438/291 |
| 6,309,927 B1 | 10/2001 | Au et al. ..................... 438/261 |
| 6,319,730 B1 | * 11/2001 | Ramdani et al. ............... 438/3 |
| 6,319,775 B1 | 11/2001 | Halliyal et al. ............. 438/261 |
| 6,444,592 B1 | * 9/2002 | Ballantine et al. .......... 438/770 |
| 2002/0005556 A1 | * 1/2002 | Cartier et al. ............... 257/381 |
| 2002/0043666 A1 | * 4/2002 | Parsons et al. ............. 257/200 |
| 2002/0106536 A1 | * 8/2002 | Lee et al. .................... 428/702 |
| 2002/0130340 A1 | * 9/2002 | Ma et al. ..................... 257/295 |
| 2002/0145168 A1 | * 10/2002 | Bojarczuk, Jr. et al. | |
| 2002/0153579 A1 | * 10/2002 | Yamamoto ................. 257/412 |

FOREIGN PATENT DOCUMENTS

EP          1124262         8/2001

* cited by examiner

*Primary Examiner*—George Fourson
(74) *Attorney, Agent, or Firm*—Renner, Otto, Boisselle & Sklar, LLP (57) ABSTRACT

Numerous methods for forming various semiconductor structures are disclosed. In one embodiment, a layered dielectric structure of alternating sub-layers of a first dielectric material and a second dielectric material is formed on a suitable semiconductor substrate. In this embodiment, the layered dielectric structure comprises an alternating pattern of at least two sub-layers of a first dielectric material which is a high-K dielectric material and at least one layer of a second dielectric material which is a standard-K dielectric material, wherein at least one of the one or more second dielectric material sub-layers contain nitrogen implanted therein using a nitridation step.

20 Claims, 4 Drawing Sheets

PREPARATION OF STACK HIGH-K GATE DIELECTRICS WITH NITRIDED LAYER

FIELD OF THE INVENTION

The invention relates generally to the fabrication of semiconductor devices and, more particularly, to the fabrication of high-K dielectric layers in semiconductor devices.

BACKGROUND OF THE INVENTION

Fabrication of semiconductor devices, such as a metal-oxide-semiconductor (MOS) integrated circuit, involves numerous processing steps. In a semiconductor device, a gate dielectric, typically formed from silicon dioxide ("oxide"), is formed on a semiconductor substrate which is doped with either n-type or p-type impurities. For each MOS field effect transistor (MOSFET) being formed, a gate conductor is formed over the gate dielectric, and dopant impurities are introduced into the substrate to form a source and drain. A pervasive trend in modern integrated circuit manufacture is to produce transistors having feature sizes as small as possible. Many present processes employ features, such as gate conductors and interconnects, which have less than 0.18 $\mu$m critical dimension. As feature sizes continue to decrease, the size of the resulting transistor as well as the interconnect between transistors also decreases. Fabrication of smaller transistors allows more transistors to be placed on a single monolithic substrate, thereby allowing relatively large circuit systems to be incorporated on a single, relatively small die area.

As MOSFET feature sizes decrease, gate oxide thickness decreases as well. This decrease in gate oxide thickness is driven in part by the demands of overall device scaling. As gate conductor widths decrease, for example, other device dimensions must also decrease in order to maintain proper device operation. Early MOSFET scaling techniques involved decreasing all dimensions and voltages by a constant scaling factor, to maintain constant electric fields in the device as the feature size decreased. This approach has given way to more flexible scaling guidelines which account for operating characteristics of short-channel devices. For example, a maximum value of MOSFET sub-threshold current can be maintained while feature sizes shrink, by decreasing any or all of several quantities, including gate oxide thickness, operating voltage, depletion width, and junction depth, by appropriate amounts.

As a result of the continuing decrease in feature size, gate oxide thickness has been reduced so much that oxides are approaching thicknesses on the order of ten angstroms (Å). Unfortunately, thin oxide films may break down when subjected to an electric field, particularly for gate oxides less than 50 Å thick. It is probable that even for a relatively low gate voltage of 3V, electrons can pass through such a thin gate oxide by a quantum mechanical tunneling effect. In this manner, a tunneling current may undesirably form between the semiconductor substrate and the gate conductor, adversely affecting the operability of the device. It is postulated that some of these electrons may become entrapped within the gate oxide by, e.g., dangling bonds. As a result, a net negative charge density may form in the gate oxide. As the trapped charge accumulates with time, the threshold voltage $V_T$ may shift from its design specification. Breakdown of the gate oxide may also occur at even lower values of gate voltage, as a result of defects in the gate oxide. Such defects are unfortunately prevalent in relatively thin gate oxides. For example, a thin gate oxide often contains pin-holes and/or localized voids due to unevenness at which the oxide grows on a less than perfect silicon lattice.

A more promising approach to further increasing gate dielectric capacitance may be to increase the permittivity of the gate dielectric. Permittivity, $\epsilon$, of a material reflects the ability of the material to be polarized by an electric field. The permittivity of a material is typically described as its permittivity normalized to the permittivity of a vacuum, $\epsilon_0$. Hence, the relative permittivity, referred to as the dielectric constant, of a material is defined as:

$$K=\epsilon/\epsilon_0$$

While silicon dioxide (sometimes simply referred to as "oxide") has a dielectric constant of approximately 3.9, other materials have higher K values. Silicon nitride ("nitride"), for example, has a K of about 6 to 9 (depending on formation conditions). Much higher K values of, for example, 20 or more can be obtained with various transition metal oxides including tantalum oxide ($Ta_2O_5$), barium strontium titanate ("BST"), and lead zirconate titanate ("PZT"). Using a high-K dielectric material for a gate dielectric would allow a high capacitance to be achieved even with a relatively thick dielectric layer. For example, a nitride gate dielectric with a K of 7.8 and a thickness of 100 angstroms is substantially electrically equivalent to an oxide gate dielectric (K about 3.9) having a thickness of about 50 angstroms. For even higher-K dielectric materials, even thicker gate dielectric layers could be formed while maintaining capacitance values higher than are possible with even very thin oxide layers. In this way, the reliability problems associated with very thin dielectric layers may be avoided while transistor performance is increased.

One problem which has been reported relating to integration of high-K dielectric materials is oxidation of silicon by certain high-K dielectric materials when the high-K dielectric material is formed directly on a silicon substrate. Since oxidation results in formation of what may be referred to as a "standard-K" dielectric material, some of the benefit of the high-K dielectric material is considered to be lost. In addition, reactions considered adverse between the high-K dielectric material and standard-K dielectric materials may also occur.

Thus, a method of forming a relatively high-K dielectric material which either overcomes or takes advantage of such reactions, and which provides the electrical advantages of a higher K, is needed.

SUMMARY OF THE INVENTION

The present invention relates to a method of making a semiconductor device having a composite dielectric layer, comprising: providing a semiconductor substrate; depositing on the semiconductor substrate alternating sub-layers of a first dielectric material and a second dielectric material to form a layered dielectric structure having at least two sub-layers of the first dielectric material and at least one sub-layer of the second dielectric material, wherein the first dielectric material is a high-K dielectric material and the second dielectric material is a standard-K dielectric material, and at least one of the one or more dielectric material sub-layers contain nitrogen implanted therein using a nitridation step; and annealing the layered dielectric structure at an elevated temperature to form a composite dielectric layer about the boundary of each first dielectric material layer/second dielectric material layer.

The present invention further relates to a method of making a semiconductor device having a composite dielectric layer, comprising: providing a semiconductor substrate; depositing on the semiconductor substrate alternating sub-layers of a first dielectric material and a second dielectric material to form a layered dielectric structure having at least two sub-layers of the first dielectric material and at two sub-layers of the second dielectric material, wherein the first dielectric material is a standard-K dielectric material and the second dielectric material is a high-K dielectric material, and at least one of dielectric material sub-layers contain nitrogen implanted therein using a nitridation step; and annealing the layered dielectric structure at an elevated temperature to form a composite dielectric layer about the boundary of each first dielectric material layer/second dielectric material layer.

The present invention further relates to a method of making a semiconductor device having a composite dielectric layer, comprising: providing a semiconductor substrate; subjecting the semiconductor substrate to a nitridation step to produce a layer of standard-K dielectric material in the upper portion of one side of the semiconductor substrate; depositing on the standard-K dielectric side of the semiconductor substrate alternating sub-layers of a first dielectric material and a second dielectric material to form a layered dielectric structure having at least one sub-layer of the first dielectric material and at least one sub-layer of the second dielectric material, wherein the first dielectric material is a high-K dielectric material and the second dielectric material is a standard-K dielectric material, and at least one of the one or more dielectric material sub-layers contain nitrogen implanted therein using a nitridation step; and annealing the layered dielectric structure at an elevated temperature to form a composite dielectric layer about the boundary of each first dielectric material layer/second dielectric material layer.

Thus, the present invention overcomes the problem of forming a high-K dielectric material which overcomes and takes advantage of previously disfavored reactions between dielectric materials, to form a composite dielectric layer which includes a reaction product of the high-K dielectric material and the standard-K dielectric material, which is obtained by annealing a layered dielectric structure at an elevated temperature.

DETAILED DESCRIPTION

As used herein, the term "standard-K dielectric" refers to a dielectric material having a K up to about 10. Such standard-K dielectric materials include, for example, silicon dioxide, which has a K of about 4, silicon oxynitride, which has a K of about 4–8 depending on the relative content of oxygen and nitrogen, and silicon nitride, which has a K of about 6–9.

As used herein, the term "mid-K dielectric material" refers to a dielectric material having a K in the range from about 10 to about 20. Such mid-K dielectric materials include, for example, composite materials such as hafnium silicate, which has a K of about 14, and hafnium silicon oxynitride, which has a K of about 16, depending on the relative content of oxygen and nitrogen, and hafnium silicon nitride, which has a K of about 18.

As used herein, the term "high-K dielectric" refers to a dielectric material having a K of about 20 or more. Such high-K dielectric materials include, for example, $HfO_2$, $ZrO_2$, $Ta_2O_5$ and others identified more fully below.

Approximate K-values or, in some cases, a range of K-values, are shown below in Table 1 for several exemplary dielectric materials. It is understood that the present invention is not limited to the specific dielectric materials disclosed herein, but may include any appropriate standard-K and high-K dielectric materials which are known and are compatible with the remaining elements of the semiconductor device with which the dielectric materials are to be used.

Additionally, it should be noted that in the following text, range and ratio limits may be combined.

TABLE 1

| Dielectric Material | Dielectric Constant (K) (Relative Permittivity) |
| --- | --- |
| silicon dioxide | 3.9 |
| silicon nitride | 6–9 |
| silicon oxynitride | 4–8 |
| zirconium silicate | 12 |
| hafnium silicate | 15 |
| lanthanum oxide, $La_2O_3$ | 20–30 |
| hafnium oxide, $HfO_2$ | 40 |
| zirconium oxide, $ZrO_2$ | 25 |
| cesium oxide, $CeO_2$ | 26 |
| bismuth silicon oxide, $Bi_4Si_2O_{12}$ | 35–75 |
| titanium dioxide, $TiO_2$ | 30 |
| tantalum oxide, $Ta_2O_5$ | 26 |
| tungsten oxide, $WO_3$ | 42 |
| yttrium oxide, $Y_2O_3$ | 20 |
| BST ($Ba_{1-x}Sr_xTiO_3$) | ~20—200 |
| barium strontium oxide ($Ba_{1-x}Sr_xO_3$) | ~20—200 |
| PST ($PbSc_xTa_{1-x}O_3$) | ~3000 |
| PZN ($PbZn_xNb_{1-x}O_3$) | ~7000 |
| PZT ($PbZr_xTi_{1-x}O_3$) | ~150—600 |

It is noted that the K-values, or relative permittivity, for both standard-K and high-K dielectric materials may vary to some degree depending on the exact nature of the dielectric material and on the process used to deposit the material. Thus, for example, differences in purity, crystallinity and stoichiometry, may give rise to variations in the exact K-value determined for any particular dielectric material.

As used herein, when a material is referred to by a specific chemical name or formula, the material may include non-stoichiometric variations of the stoichiometrically exact formula identified by the chemical name. For example, tantalum oxide, when stoichiometrically exact, has the chemical formula $Ta_2O_5$. As used herein, the term "tantalum oxide" may include variants of stoichiometric $Ta_2O_5$, which may be referred to as $Ta_xO_y$, in which either of x or y vary by a small amount. For example, in one embodiment, x may vary from about 1.5 to 2.5, and y may vary from about 4.5 to about 5.5. In another embodiment, x may vary from about 1.75 to 2.25, and y may vary from about 4 to about 6. Such variations from the exact stoichiometric formula fall within the definition of tantalum oxide. Similar variations from exact stoichiometry are included when the chemical formula for a compound is used. For example, again using tantalum oxide as an example, when the formula $Ta_2O_5$ is used, $Ta_xO_y$ as defined above, is included within the meaning. Thus, in the present disclosure, exact stoichiometry is intended only when such is explicitly so stated. As will be understood by those of skill in the art, such variations may occur naturally, or may be sought and controlled by selection and control of the conditions under which materials are formed.

As used herein, the term "anneal" or "annealing" refers to a step or process in which a material is exposed to an elevated (e.g., above 500° C.) temperature for a time. The annealing may be a discrete step of annealing, such as a rapid thermal anneal (RTA), or it may be part of another step, such as a chemical vapor deposition (CVD) step, which is carried out at an elevated temperature. In either case, annealing includes exposure to an elevated temperature, and may include appropriate additional conditions, such as a selected atmosphere and pressure, for a selected period of time.

Semiconductor Devices

Figure 1:
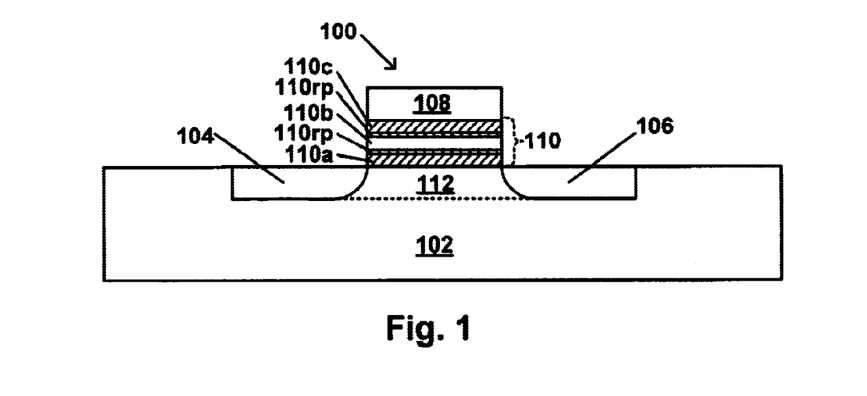
FIG. 1 is a schematic cross-sectional view of a field effect transistor including an embodiment of a composite dielectric layer in accordance with the present invention.

The present invention is described hereinbelow in terms of a common semiconductor device, specifically, a metal oxide semiconductor field effect transistor (MOSFET) formed on a silicon substrate. An embodiment of the present invention in a MOSFET is shown in FIG. 1. The present invention is not limited to this illustrative embodiment, however, and may be applied to any semiconductor device in which a dielectric layer is needed, for example, as a gate dielectric in a FET, as a gate dielectric in a floating gate EEPROM flash memory device, in a SONOS-type flash memory device, such as the Mirror-Bit™ SONOS-type flash memory device available from Advanced Micro Devices, Sunnyvale, Calif. Thus, it is to be understood that the present invention is not limited to the specific illustrative embodiments described below.

The present invention relates to a semiconductor device and to a method of making the semiconductor device, in which the semiconductor device includes a composite dielectric layer formed from a plurality of alternating sub-layers of a high-K dielectric material and a standard-K dielectric material in a layered dielectric structure. The layered dielectric structure is subsequently annealed, as a result of which a composite dielectric layer is formed. In one embodiment, the composite dielectric layer comprises a reaction product which is a metal silicate.

Figure 4:
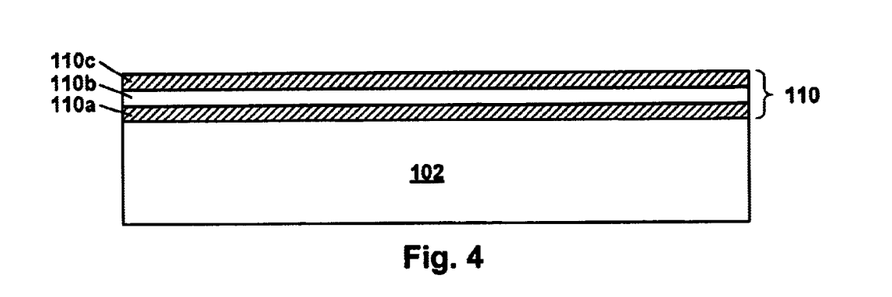
FIG. 4 is a schematic cross-sectional view of a semiconductor substrate with first, second and third sub-layers applied thereto in accordance with the present invention.
Figure 5:
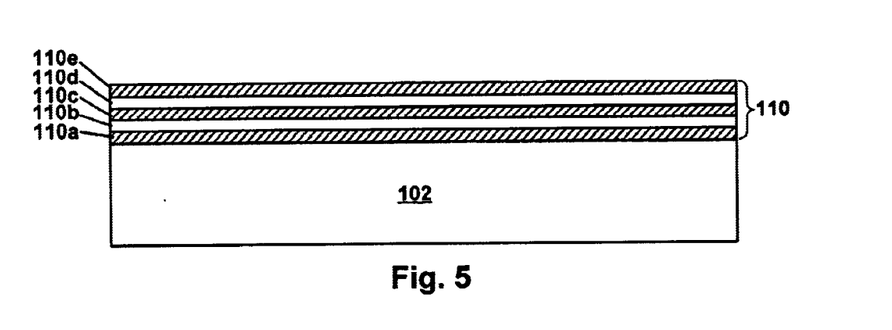
FIG. 5 is a schematic cross-sectional view of a semiconductor substrate with first through fifth sub-layers applied thereto in accordance with the present invention.
Figure 6:
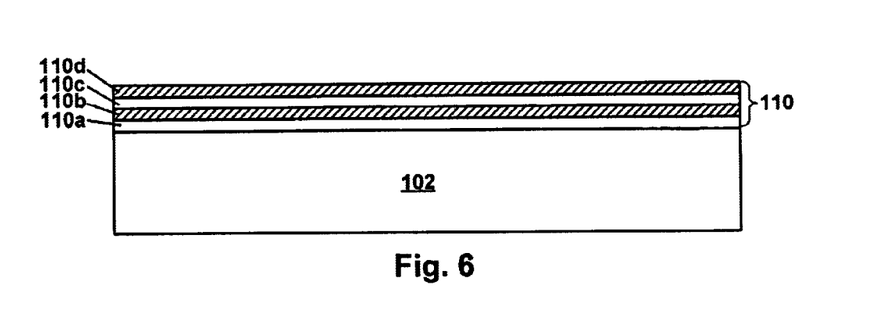
FIG. 6 is a schematic cross-sectional view of a semiconductor substrate with first through fourth sub-layers applied thereto in accordance with the present invention.

Thus, in a first embodiment, the present invention relates to a semiconductor device having a composite dielectric layer. The semiconductor device includes a semiconductor substrate and at least one composite dielectric layer including and/or formed from alternating sub-layers of a first dielectric material and a second dielectric material on the semiconductor substrate. Together, prior to annealing, the alternating sub-layers form a layered dielectric structure having at least two sub-layers of at least one of the first dielectric material and the second dielectric material. One of the first dielectric material and the second dielectric material is a high-K dielectric material. The other of the first and second dielectric materials is a standard-K dielectric material. Examples of embodiments prior to annealing are shown in FIGS. 4–6.

Figure 7:
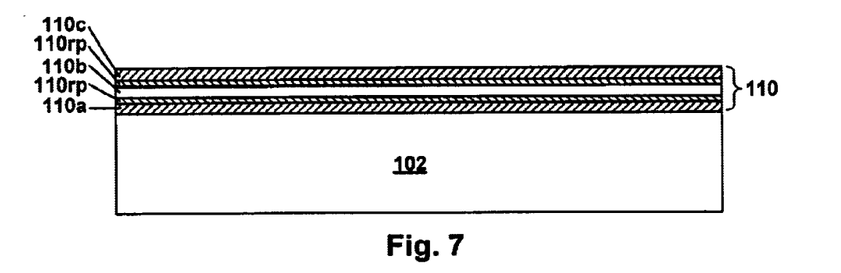
FIG. 7 is a schematic cross-sectional view of one embodiment of a semiconductor substrate following a step of annealing.
Figure 8:
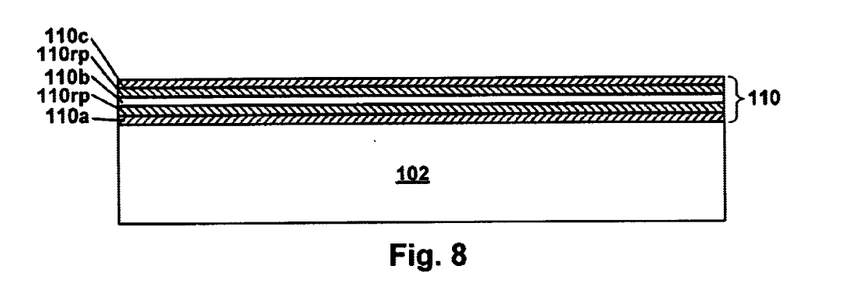
FIG. 8 is a schematic cross-sectional view of another embodiment of a semiconductor substrate following a step of annealing, similar to that shown in FIG. 7.
Figure 9:
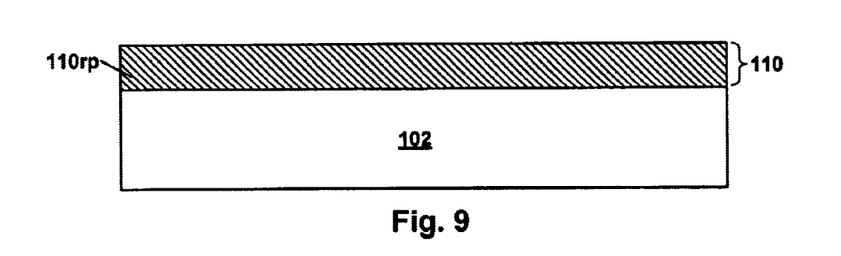
FIG. 9 is a schematic cross-sectional view of yet another embodiment of a semiconductor substrate following a step of annealing, similar to that shown in FIGS. 7 and 8.

The composite dielectric layer formed by annealing at a high temperature the layered dielectric structure includes a reaction product of the high-K dielectric material and the standard-K dielectric material. The reaction product is formed during the annealing of the alternating sub-layers of the first and second dielectric materials, at a high temperature. At the annealing temperature, the alternating sub-layers of dielectric materials combine or react with each other, at least at the interfaces of the alternating sub-layers, to form the composite dielectric layer which includes a reaction product of the dielectric materials of the respective sub-layers. The reaction product and/or the composite dielectric layer as a whole may have a K-value intermediate the K-values of the high-K dielectric material and standard-K dielectric material from which the reaction product was formed. Thus, the reaction product may be referred to as a mid-K dielectric material, as defined above. Examples of the composite dielectric layer of the present invention are shown in FIGS. 7–9.

In one embodiment, the annealing at a high temperature may be any type of annealing or thermal treatment such as a post deposition annealing, RTA, or thermal heating applied by or during a subsequent deposition step. In such an embodiment, the annealing at a high temperature need not immediately follow the preceding steps of the method of the present invention, and other production steps may intervene between these steps, within the scope of the invention. In another embodiment, the step of annealing at a high temperature follows substantially immediately the preceding steps of the method, not including routine handling and preparatory steps.

In one embodiment, the semiconductor substrate is a bulk silicon substrate. In one embodiment, the semiconductor substrate is a silicon-on-insulator semiconductor substrate. In another embodiment, the semiconductor substrate is a p-doped silicon substrate. Suitable semiconductor substrates include, for example, bulk silicon semiconductor substrates, silicon-on-insulator (SOI) semiconductor substrates, silicon-on-sapphire (SOS) semiconductor substrates, and semiconductor substrates formed of other materials known in the art. The present invention is not limited to any particular type of semiconductor substrate.

FIG. 1 is a schematic cross-sectional view of a MOSFET 100. The MOSFET 100 includes, for example, a p-doped silicon substrate 102, an n-doped source region 104, an n-doped drain region 106, a gate 108, a gate composite dielectric layer 110, and a channel region 112.

Not shown in FIG. 1 are additional parts of a working semiconductor device, such as electrical conductors, protective coatings and other parts of the structure which would be included in a complete, working semiconductor device. These additional parts are not necessary to the present invention, and for simplicity and brevity are neither shown nor described, but could be easily added as will be understood by those of skill in the art.

The gate composite dielectric layer 110 illustrated in FIG. 1, has a structure including five sub-layers; thus the gate dielectric 110 is a composite dielectric layer. The gate composite dielectric layer 110 illustrated in FIG. 1 has two sub-layers 110a and 110c of a first dielectric material and one sub-layer 110b of a second dielectric material, and two sub-layers 110rp of a reaction product obtained by the reaction or combination of the dielectric materials of the sub-layers 110a–110c.

The layered dielectric structure 110 of FIG. 1 comprises three alternating sub-layers 110a–110c, separated by a reaction product sub-layer 110rp following the annealing step, described below. The layered dielectric structure 110 could comprise any number of additional alternating sub-layers 110a–110ωc, where ω represents a letter corresponding to the number of sub-layers, from 3 to about 10, with each pair of sub-layers separated by a reaction product sub-layer 110rp, following the annealing step. In one embodiment, the layered dielectric structure includes four alternating sub-layers (ω=4), in another, five alternating sub-layers (ω=5), and in another six alternating sub-layers (ω=6), and in yet another, seven alternating sub-layers (ω=7). Higher numbers of alternating sub-layers may be present, but from 3 to about 7 alternating sub-layers (ω=3–7) are considered most useful at present. In each case, the sub-layers of dielectric materials, following the annealing step, are separated by a reaction product sub-layer 110rp. As described more fully below, the relative thickness of these sub-layers may be selected and controlled as desired. In one embodiment, the alternating sub-layers are completely combined or reacted together to form a composite dielectric layer which is substantially uniform.

The layered dielectric structure 110 shown in FIG. 4 includes two similar sub-layers 110a and 110c, and a dissimilar third sub-layer, 110b. In one embodiment, the two similar sub-layers 110a and 110c each comprise a high-K dielectric material, and the dissimilar third sub-layer 110b comprises a standard-K dielectric material. In another embodiment, the opposite arrangement is used, i.e., the two similar sub-layers 110a and 110c each comprise a standard-K dielectric material, and the dissimilar third sub-layer 110b comprises a high-K dielectric material. In the embodiment shown in FIG. 5, the layered dielectric structure 110 comprises five sub-layers, 110a–110e, alternating in a pattern which continues one of the patterns described above for the three sub-layer pattern 110a–110c. In the embodiment shown in FIG. 6, the layered dielectric structure 110 comprises four sub-layers, 110a–110d, alternating in a pattern which is similar to one of the patterns described above for the three sub-layer pattern 110a–110c, except that the lowermost and uppermost sub-layers, 110a and 110d, are different in this embodiment. In other embodiments, the number of sub-layers may vary as described above, but the sub-layers alternate in each such embodiment.

As noted above with respect to FIG. 6, in an embodiment in which there is an even number of sub-layers in the layered dielectric structure 110, the lowermost sub-layer may be a high-K dielectric material and the uppermost sub-layer may be a standard-K dielectric material. In another embodiment having an even number of sub-layers in the layered dielectric structure 110, the lowermost sub-layer may be a standard-K dielectric material and the uppermost sub-layer may be a high-K dielectric material. FIG. 6 is applicable to either even number sub-layer case.

In summary, the number of sub-layers 110a–110ω of the layered dielectric structure 110 may be odd or even, and the uppermost and lowermost sub-layers may be either the high-K dielectric material or the standard-K dielectric material, and the number of sub-layers of each type may be equal or unequal. The first dielectric material may be the high-K dielectric material or the standard-K dielectric material, and conversely, the second dielectric material may be the high-K dielectric material or the standard-K dielectric material.

In one embodiment, the standard-K dielectric material includes at least one of silicon, silicon oxide, silicon dioxide, silicon oxynitride, silicon nitride and silicon-rich silicon nitride. Thus, in one embodiment of the present invention, the standard-K material comprises silicon. In one embodiment, the standard-K dielectric material is silicon dioxide. In one embodiment, the standard-K dielectric material is silicon nitride. In one embodiment, the standard-K dielectric material is silicon oxynitride.

In another embodiment, the standard-K dielectric material is formed from a layer of silicon, silicon oxide and/or silicon dioxide which has been subjected to a nitridation step as detailed below implant therein nitrogen atoms (or even additional nitrogen atoms).

In one embodiment, the high-K dielectric material includes at least one of hafnium oxide ($HfO_2$), zirconium oxide ($ZrO_2$), tantalum oxide ($Ta_2O_5$), barium titanate ($BaTiO_3$), titanium dioxide ($TiO_2$), cesium oxide ($CeO_2$), lanthanum oxide ($La_2O_3$), tungsten oxide ($WO_3$), yttrium oxide ($Y_2O_3$), bismuth silicon oxide ($Bi_4Si_2O_{12}$), barium strontium oxide ($Ba_{1-x}Sr_xO_3$), barium strontium titanate (BST) ($Ba_{1-x}Sr_xTiO_3$), PZN ($PbZn_xNb_{1-x}O_3$), and PST ($PbSc_xTa_{1-x}O_3$). In addition to the foregoing high-K dielectrics, other high-K dielectric materials, for example, ferroelectric high-K dielectric materials such as lead zirconium titanate, lead lanthanum titanate, strontium bismuth tantalate, bismuth titanate, strontium titanate, lead zirconate titanate (PZT ($PbZr_xTi_{1-x}O_3$)) and barium zirconium titanate may be suitably used in the present invention. Other high-K dielectric materials known in the art also may be used in the present invention.

In another embodiment, the high-K dielectric material is formed from a layer of suitable high-K material which has been subjected to a nitridation step, as detailed below, to implant therein nitrogen atoms (or even additional nitrogen atoms).

The composite dielectric layer, which may or may not be substantially uniform throughout, comprises the reaction product of the high-K dielectric material and the standard-K dielectric material and is formed by annealing the layered dielectric structure at an elevated temperature. The reaction product includes the elements of both the high-K dielectric material and the standard-K dielectric material. For example, in an embodiment in which the high-K dielectric material is hafnium oxide and the standard-K dielectric material is silicon dioxide, the reaction product is a silicate compound containing hafnium, silicon and oxygen, Hf/Si/O. In one embodiment, the reaction product is hafnium silicate, $HfSiO_4$. Thus, in an embodiment in which the high-K dielectric material contains a metal atom, e.g., in the form of a metal oxide, and the standard-K dielectric material is a silicate, the reaction product is a metal-containing silicate. In an embodiment in which the high-K dielectric material is hafnium and the standard-K dielectric material contains silicon oxynitride, the reaction product in the composite dielectric layer includes hafnium, silicon, oxygen and nitrogen.

In another embodiment, the high-K dielectric material is zirconium oxide and the standard-K dielectric material is silicon dioxide, and the composite dielectric layer includes zirconium, silicon and oxygen. In one such embodiment, the reaction product is zirconium silicate, $ZrSiO_4$. In yet another embodiment, the high-K dielectric material is cesium oxide and the standard-K dielectric material is silicon oxynitride, and the composite dielectric layer includes cesium, silicon, nitrogen and oxygen. In still another embodiment, the high-K dielectric material is tantalum oxide and the standard-K dielectric material is silicon nitride, and the composite dielectric layer includes tantalum, silicon and nitrogen. As demonstrated by the foregoing embodiments, the reaction product is a composite of the high-K dielectric material and the standard-K dielectric material.

The reaction product, which is a dielectric material comprising a composite of a high-K dielectric material and a standard-K dielectric material, in one embodiment has a K in the range from about 10 to about 20. In another embodiment, the reaction product has a K which is intermediate the K of the high-K dielectric material and the K of the standard-K dielectric material. Thus, the reaction product, or composite dielectric material, may be conveniently referred to as a mid-K dielectric material, as defined above.

In one embodiment, the reaction product has a K which can be estimated by finding the weighted average of the K's of the high-K dielectric material and the standard-K dielectric material. For example, a reaction product having a K of about 14 would be obtained from an equal number of sub-layers of equal thickness of hafnium oxide, having a K of about 24, and silicon dioxide, having a K of about 3.9.

The composite dielectric layer, in one embodiment, is an amorphous material. In one embodiment, the composite dielectric layer of the present invention, when formed from hafnium oxide, a usually crystalline material, and silicon dioxide, an amorphous material, has an amorphous structure. In an embodiment in which the high-K dielectric material is normally crystalline, and in which at least a partial sub-layer of the high-K dielectric material remains in the composite dielectric layer, the high-K dielectric material may be present in a crystalline form or may be rendered amorphous. The normally crystalline high-K material may be rendered amorphous or less crystalline by the proximity of the amorphous reaction product or the amorphous standard-K dielectric material.

The sub-layers may be applied in thicknesses and numbers appropriate to the desired final, total thickness of the composite dielectric layer. The thicknesses and numbers of the sub-layers may be selected to control the ratios of metal to silicon to oxygen in the composite dielectric layer. For example, if a total final thickness of 50 angstroms (Å) is desired, three sub-layers of about 17 Å each, four sub-layers of about 12.5 Å each, or five sub-layers of about 10 Å may be used. With respect to the ratio of metal to silicon in the composite dielectric layer, consider an example in which the ratio of metal to silicon is desired to be relatively high. Five sub-layers of about 10 Å each may be used, in which the first and third and fifth sub-layers are, for example, hafnium oxide, and the second and fourth sub-layers are silicon dioxide. This arrangement will yield a dielectric layer relatively rich in hafnium, as compared to a composite using, for example, four sub-layers of about 12.5 Å, in which two of the sub-layers are hafnium oxide and two of the sub-layers are silicon dioxide. If a further increase in the K value, or in the ratio of metal to silicon in the composite dielectric layer is desired, the thicknesses of the sub-layers of high-K dielectric material may be increased with respect to the thicknesses of the standard-K dielectric material. Similarly, an increase in the relative thickness or number of sub-layers of standard-K dielectric material vis-a-vis the high-K dielectric material will reduce the K of the composite dielectric layer, as compared to a composite dielectric layer having relatively less thick or less numerous sub-layers vis-a-vis the high-K dielectric material.

The layered dielectric structure and the composite dielectric layer 110 illustrated in FIGS. 1–9 are depicted with discrete sub-layers. When the sub-layers, e.g., sub-layers 110a, 110b and 110c, are deposited, the sub-layers are discrete as shown in FIGS. 2–6, for example. Following the step of annealing described below, in which the respective first and second dielectric materials in the sub-layers combine or react with each other to form a reaction product which is a composite or hybrid material, to some degree each of the discrete sub-layers, including the sub-layers 110rp of the reaction product, will be blended into the adjacent sub-layers, so that the boundary from one sub-layer to the next may be indeterminate. Thus, the various sub-layers shown in the drawings are depicted with discrete boundaries, but this may not be the case in actual practice.

In one embodiment, some portion of the layers as deposited will remain intact. In another embodiment, the layered dielectric structure will be substantially or totally blended.

Methods of Making a Composite Dielectric Layer in Semiconductor Devices

The present invention further relates to a method of making the above-described semiconductor device. Thus, the present invention includes a method of making a semiconductor device having a composite dielectric layer. The method includes the steps of providing a semiconductor substrate; depositing on the semiconductor substrate alternating sub-layers of a first dielectric material and a second dielectric material, which together form a layered dielectric structure. The layered dielectric structure has at least two sub-layers of the first dielectric material and a least one sub-layer of the second dielectric material. One of the first dielectric material and the second dielectric material is a high-K dielectric material and an other of the first dielectric material and the second dielectric material is a standard-K dielectric material. When the alternating sub-layers have been formed into the layered dielectric structure, the structure is annealed at an elevated temperature. During the annealing, the materials of the first and second dielectric materials react together to form at least one composite dielectric layer. In one embodiment, the at least one composite dielectric layer includes a reaction product of the respective high-K dielectric material and standard-K dielectric material. The reaction product is formed at least at the interfaces of the respective alternating sub-layers of high-K dielectric material and standard-K dielectric material.

Figure 2:
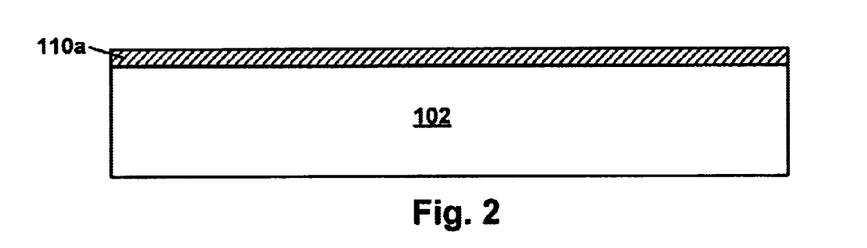
FIG. 2 is a schematic cross-sectional view of a semiconductor substrate with a first sub-layer applied thereto in accordance with the present invention.
Figure 10:
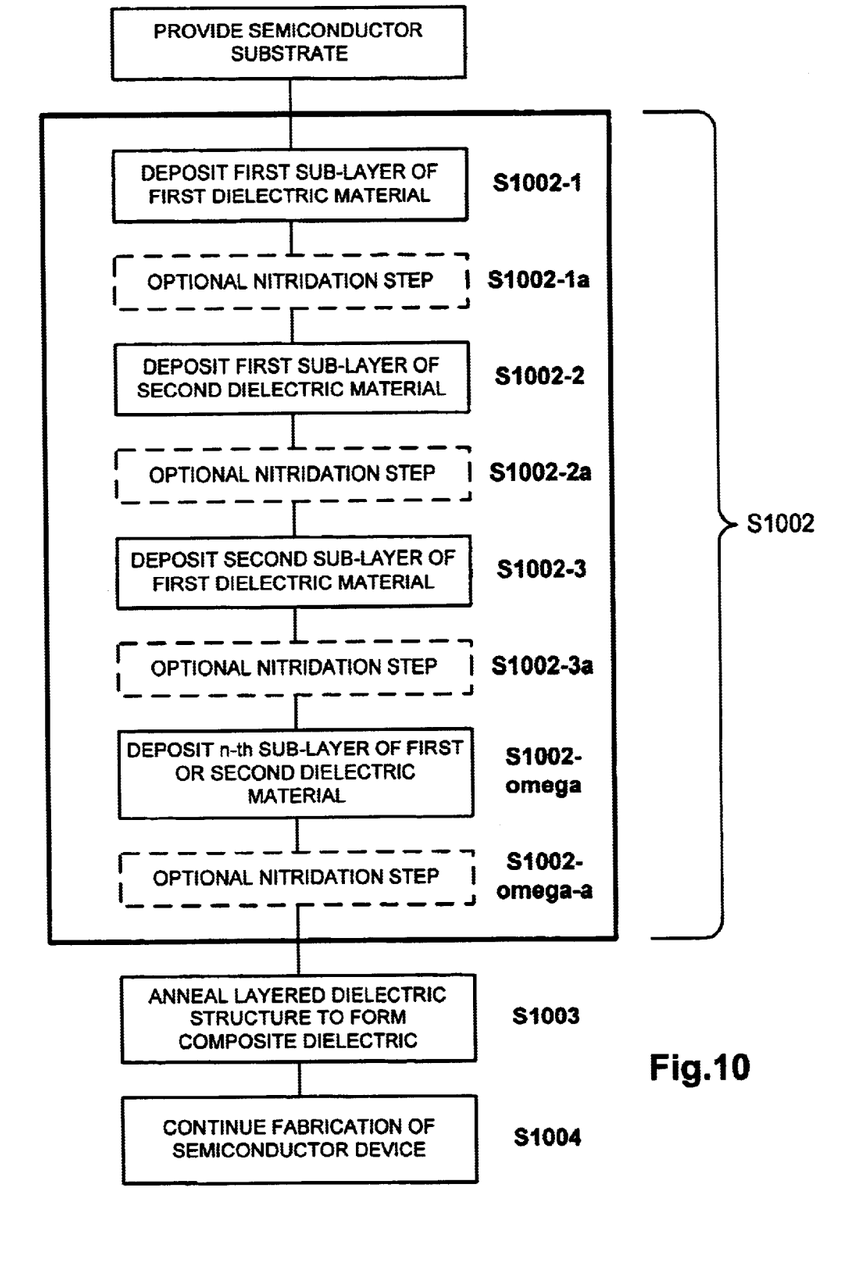
FIG. 10 is a schematic flow diagram showing the basic steps in a process of making a semiconductor device in accordance with the present invention.

In the first step of the method of the present invention, shown in FIG. 10 as Step S1001, a semiconductor substrate 102 is provided, as shown in, e.g., FIG. 2. The semiconductor substrate may be any appropriately selected semiconductor substrate known in the art, as described above.

In the second step of the method of the present invention, shown in FIG. 10 as Step S1002, a series of alternating sub-layers 110a, 110b, 110c, . . . 110ω, of dielectric materials are formed on the semiconductor substrate 102 resulting in formation of the layered dielectric structure 110. As shown in FIG. 10, the second step, S1002, can be broken down into a series of sub-steps S1002-1 . . . S1002-ω, in which the series of alternating sub-layers 110a . . . 110ω are deposited.

In one embodiment, either or both of the standard-K dielectric material and the high-K dielectric material may be deposited by chemical vapor deposition (CVD). The CVD method may be any appropriate CVD method known in the art. For example, the CVD method may be atomic layer deposition (ALD), plasma enhanced CVD (PECVD), low pressure CVD (LPCVD), atmospheric pressure CVD (APCVD), rapid-thermal CVD (RTCVD) or molecular layer doping (MLD).

In one embodiment, both the high-K dielectric material and the standard-K dielectric material are deposited in the same apparatus. In another embodiment, both the high-K dielectric material and the standard-K dielectric material are deposited in the same apparatus, and these materials are deposited sequentially by controlling the supply of precursor materials to the CVD apparatus.

Thus, for example, in an embodiment in which hafnium oxide and silicon dioxide are the first and second dielectric materials, the hafnium is supplied in the form of a hafnium-containing vapor or gas such as hafnium tetra-t-butoxide, the silicon is supplied in the form of silane gas, $SiH_4$, and the oxygen is supplied in the gaseous form. In this embodiment, if the first sub-layer is to be hafnium oxide, the hafnium-containing gas and oxygen are first provided to the CVD apparatus. When a suitable thickness of hafnium oxide has been deposited, the flow of the hafnium-containing vapor or gas is stopped, and a flow of silane gas is provided to the CVD apparatus together with the oxygen gas. When a suitable thickness of silicon dioxide has been deposited, the flow of the silane gas is stopped, and the flow of hafnium-containing vapor or gas is started again, together with the oxygen gas, and continued until a suitable thickness of hafnium oxide is deposited. This process of alternating sub-layer deposition is continued until a suitable, selected number of sub-layers of desired thickness has been deposited.

In an alternative embodiment, the sub-layers may be deposited one at a time, each in a separate apparatus. This alternative embodiment allows for different deposition methods to be used for the respective sub-layers.

Additionally, when the layers are deposited individually, a single layer can optionally be subjected to further processing steps such as a nitridation step. If the layers are deposited individually and a nitridation step is utilized, then a layer of silicon (or in some embodiments even the upper most portion of the semiconductor substrate 102) can be subjected to nitridation to form a standard-K dielectric sub-layer. Alternatively, a layer of silicon dioxide can be subjected to a nitridation step to yield a standard-K silicon dioxide sub-layer having nitrogen implanted therein. The nitridation process can also be utilized on the layers of high-K material to implant nitrogen atoms or the further increase the concentration of nitrogen therein. The nitridation process will be explained below after completion of the discussion regarding the method of the present invention.

The method of making a semiconductor device having a composite dielectric layer is described in the following disclosure with reference to FIGS. 1–10. FIG. 10 is a flow diagram schematically presenting the steps of making the semiconductor device of the present invention.

FIG. 2 shows the semiconductor substrate 102 after application of a first sub-layer 110a of a first dielectric material, i.e., at the completion of sub-step S1002-1. It should be noted that, if desirable, sub-layer 110a can be subjected to a nitridation step prior to the deposition of sub-layer 110b, regardless of whether layer 110a is a layer of standard-K or high-K material. This optional step is represented in FIG. 10 by sub-step S1002-1a. Alternatively, sub-layer 110a could be formed by exposing the semiconductor substrate 102 to a nitridation step. This step is not shown in FIG. 10 but would occur prior to step S1002-1.

Figure 3:
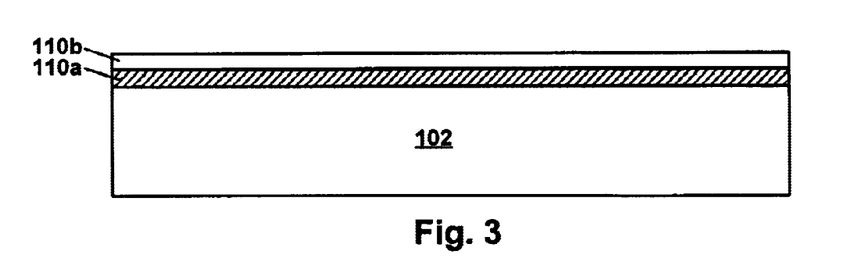
FIG. 3 is a schematic cross-sectional view of a semiconductor substrate with first and second sub-layers applied thereto in accordance with the present invention.

FIG. 3 shows the semiconductor substrate 102 after application of a second sub-layer 110b of a second dielectric material, i.e., at the completion of sub-step S1002-2. It should be noted that, if desired, sub-layer 110b can be subjected to a nitridation step prior to the deposition of sub-layer 110c, regardless of whether layer 110b is a layer of standard-K or high-K material. This optional step is represented in FIG. 10 by sub-step S1002-2a.

FIG. 4 shows the semiconductor substrate 102 after application of a third sub-layer 110c of the first dielectric material, i.e., at the completion of sub-step S1002-3. It should be noted that, if desired, sub-layer 110c can be subjected to a nitridation step prior to the deposition of sub-layer 110d, regardless of whether layer 110c is a layer of standard-K or high-K material. This optional step is represented in FIG. 10 by sub-step S1002-3a.

The sub-steps S1002-1 to S1002-$\omega$ (and optionally any of sub-steps S1002-1a to S1002-$\omega$a) of Step S1002 are repeated and continued until a selected number co of sub-layers 110 have been deposited to form a layered dielectric structure 110. In the embodiment illustrated in FIG. 4, sub-steps S1002-1 through S1002-3 have been carried out, to deposit the layered dielectric structure 110 having a total of three sub-layers 110a–110c ($\omega$=3).

In the embodiment illustrated in FIG. 5, sub-steps S1002-1 through S1002-5 have been carried out, to deposit the layered dielectric structure 110 having a total of five sub-layers 110a–110e (co=5). In the embodiment illustrated in FIG. 6, sub-steps S1002-1 through S1002-4 have been carried out, to deposit the layered dielectric structure 110 having a total of four sub-layers 110a–110d ($\omega$=4). Deposition of the sub-layers 110a–110$\omega$ forms a layered dielectric structure 110, as shown in FIGS. 4, 5 and 6.

Although not specifically referred to therein, the structures of FIGS. 4, 5 and 6 can include one or more sub-layers formed from either standard-K dielectric materials or high-K dielectric materials which have been formed or subsequently subjected to the previously mentioned optional nitridation step.

When a suitable number of sub-layers has been deposited on the semiconductor substrate, the layered dielectric structure is annealed, as shown in Step S1003 in FIG. 10. As a result of the step of annealing, the sub-layers of the high-K dielectric material and the standard-K dielectric material in the layered dielectric structure 110 react or combine, at least at the interfaces between adjacent sub-layers, to form the composite dielectric layer 110. Several embodiments of the composite dielectric layer 110 are shown in FIGS. 1 and 7–9.

The annealing step is carried out at a temperature in the range from about 700° C. to about 1150° C. In one embodiment, the annealing temperature is in the range from about 950° C. to about 1100° C., and in another it is about 1000° C. to about 1050° C. In one embodiment, the annealing step is applied as an rapid thermal anneal (RTA) technique, in which annealing is performed in $O_2$, NO, $N_2O$ or $N_2$ or mixtures thereof, for a few seconds to a few minutes. The annealing time should be sufficient to form the composite dielectric layer, as described herein. In one embodiment, the annealing time is sufficient to form a reaction product which is a composite of the high-K dielectric material and the standard-K dielectric material.

The annealing step, in one embodiment, is carried out in an atmosphere which includes oxygen, and in one embodiment, the atmosphere is air. In another embodiment, the atmosphere is an inert gas such as nitrogen or argon. In another embodiment, the annealing step is carried out at a reduced pressure, in one embodiment under a vacuum in the range from approximately 0.01 Torr to about 1 Torr. In another embodiment, the annealing step is carried out in a reducing atmosphere, such as hydrogen. The annealing step may be carried out by any method and under any conditions suitable for the materials, and which will result in the formation of the reaction product of which the composite dielectric layer is comprised, as will be understood by those skilled in the art.

As a result of the annealing step, a reaction or other combination occurs between the high-K dielectric material and the standard-K dielectric material, at least at the interfaces between adjacent sub-layers of the respective dielectric materials, as a result of which the reaction product is formed.

As described above, the reaction product represents a composite of the high-K dielectric material and the standard-K dielectric material, and may occur (a) substantially only at the interfaces between the adjacent sub-layers, or (b) both at the interfaces and extending partially through the adjacent sub-layers, or (c) substantially throughout the entirety of the sub-layers. In either of (a) or (b), the composite dielectric layer which is formed comprises at least some portion of the sub-layers of the high-K dielectric material and the standard-K dielectric material together with at least some portion of a reaction product sub-layer. In (c), substantially the entirety of the composite dielectric layer is the reaction product.

FIGS. 7–9 show schematically conditions (a), (b) and (c), respectively, each following a step of annealing. FIG. 7 shows schematically an embodiment which corresponds to condition (a), in which the reaction product has been formed substantially only at the interfaces between the first and second dielectric material sub-layers. As shown in FIG. 7, a substantial portion of each of the original first and second dielectric material sub-layers 110a–110c remain, but the sub-layers 110a–110c are now separated by two additional sub-layers 110rp of the reaction product. The embodiment shown in FIG. 1 is similar to that shown in FIG. 7, and also corresponds to condition (a).

FIG. 8 shows schematically an embodiment which corresponds to condition (b), in which the reaction product has been formed both at the interfaces and extending partially through the adjacent sub-layers. As shown in FIG. 8, a portion of each of the original first and second dielectric material sub-layers 110a–110c remain, and the remaining sub-layers 110a–110c are separated by two additional sub-layers 110rp of the reaction product, which are relatively thicker than the embodiment shown in FIG. 7.

FIG. 9 shows schematically an embodiment which corresponds to condition (c), in which the reaction product has been formed substantially through the entirety of the composite dielectric layer 110. As shown in FIG. 9, the reaction product sub-layer 110rp extends substantially through the entire thickness of the composite dielectric layer 110. In one embodiment, the composite dielectric layer includes or is a substantially uniform layer of the reaction product of the first dielectric material and the second dielectric material.

The extent of formation of the reaction product sub-layer 110rp, and thereby the extent of the reaction product in the composite dielectric layer 110, can be selectively controlled by adjustment of the temperature and time of the annealing step S1003. A longer time and/or a higher temperature annealing step S1003 results in increased formation of the reaction product and a relative thickening of the reaction product sub-layer 110rp, as compared to a lower temperature or a shorter time annealing step S1003.

As will be recognized by those of skill in the art, each sub-layer 110a–101ω is quite thin. In one embodiment, the thickness of each sub-layer is in the range from about 5 Å to about 50 Å. As a result, it may be difficult to discern whether a given composite dielectric layer 110 corresponds to condition (a), (b) or (c), as described above. The thicknesses of the sub-layers are so small that it may not be possible to determine with certainty whether or to what extent discreet sub-layers remain. For example, while some metal oxides which form high-K dielectric materials are crystalline, and silicon dioxide is amorphous, following the annealing step S1003 the entire composite layer may be rendered amorphous, even though a small amount of discrete high-K dielectric material sub-layer remains in the composite dielectric layer 110. Suitable analytical equipment may discern the identity of the dielectric material at various levels of the composite dielectric layer 110.

A method by which to subject a sub-layer of dielectric material (be it standard-K or high-K) to nitridation will be discussed below. Nitridation can be accomplished by providing a source of nitrogen and incorporating the nitrogen into the surface of a silicon layer, a silicon oxide layer or a silicon dioxide layer. Nitrogen can even be incorporated via a nitridation step into the upper most portion of a silicon substrate. In one embodiment, where the layer subjected to nitridation is a silicon layer, the nitridation step yields a monolayer of material similar to but perhaps not measurable as silicon nitride ($Si_3N_4$). In one embodiment, a source of nitrogen is provided by ion implantation.

Referring to FIG. 2, in one embodiment a sub-first layer 110a of a standard-K dielectric which will subjected to a nitridation step is formed as follows. First a silicon oxide sub-layer 110a is formed to overlie the surface of semiconductor substrate 102. The sub-layer 110a can, in one embodiment, be formed by thermally oxidizing the surface of the semiconductor substrate 102 at an elevated temperature in the presence of dry molecular oxygen. Alternatively, a suitably thick sub-layer 110a of silicon oxide can be formed utilizing any one of CVD techniques discussed above.

In the case where the silicon oxide layer is formed from the upper most portion of the semiconductor substrate 102, an oxidation process is carried out at a temperature of about 600° C. to about 800° C. for an appropriate amount of time (e.g., from about 5 seconds to about 120 seconds). The oxidation process forms a silicon oxide layer having a thickness in the range of about 5 Å to about 50 Å thick. In another embodiment, sub-layer 110a is from about 5 Å to about 20 Å thick. The oxidation process can be carried out in either a batch-type thermal oxidation furnace, or alternatively, in a single-wafer oxidation apparatus.

After forming sub-layer 110a, a nitridation process is carried out to transform the silicon oxide layer into a nitrogenated silicon oxide layer. The nitridation process is preferably carried out by annealing semiconductor substrate 102 in a nitrogen-containing gas atmosphere. In one embodiment, gases such as ammonia, nitrogen oxide (NO), and nitrous oxide can be introduced into a batch-type thermal annealing furnace. An annealing process is then carried out at a temperature in the range of about 600° C. to about 1100° C. (or from 600° C. to about 800° C., or even from 800° C. to about 1100° C.) for an appropriate amount of time (e.g., about 5 seconds to about 600 seconds, or from 5 seconds to 120 second). The annealing process transforms the silicon oxide sub-layer 110a into a nitrogenated silicon oxide layer having a nitrogen concentration of about 0 weight percent to about 10 weight percent.

In an alternative embodiment, the nitrogenation process is carried out in an RTCVD apparatus. The same nitrogen-containing gases can be used in both the RTCVD process and the batch type furnace annealing process.

It should be appreciated that the above nitridation process is not limited to the nitridation of just a sub-layer formed on the semiconductor substrate. Rather, the above-mentioned nitridation process can be utilized on any suitable sub-layer. For example, the nitridation process can be utilized on a sub-layer of silicon, silicon oxide or silicon dioxide. These layers can be formed from any suitable technique including the CVD techniques discussed above.

While the invention has been described in conjunction with specific embodiments herein, it is evident that many alternatives, modifications and variations will be apparent to those skilled in the art in light of the foregoing description. Accordingly it is intended to embrace all such alternatives and modifications in variations as for within the spirit and broad scope of the appended claims.

What is claimed is:

1. A method of making a semiconductor device having a composite dielectric layer, comprising:
   providing a semiconductor substrate;
   depositing on the semiconductor substrate alternating sub-layers of a first dielectric material and a second dielectric material to form a layered dielectric structure having at least two sub-layers of the first dielectric material and at least one sub-layer of the second dielectric material,
   wherein the first dielectric material is a high-K dielectric material and the second dielectric material is a standard-K dielectric material, and at least one of the one or more dielectric material sub-layers contain nitrogen implanted therein using a nitridation step; and
   annealing the layered dielectric structure at an elevated temperature to form a composite dielectric layer about the boundary of each first dielectric material layer/second dielectric material layer.

2. The method of claim 1, wherein the standard-K dielectric material comprises at least one of silicon dioxide, silicon oxynitride, silicon nitride, and silicon-rich silicon nitride.

3. The method of claim 2, wherein during the step of annealing, the first dielectric material and the second dielectric material form a silicon-containing reaction product in at least one of the composite dielectric layers.

4. The method of claim 2, wherein at least one of the composite dielectric layers comprise a silicate.

5. The method of claim 3, wherein the reaction product comprises a metal atom, a silicon atom and at least one of an oxygen atom or a nitrogen atom.

6. The method of claim 1, wherein the high-K dielectric material comprises at least one of hafnium oxide, zirconium oxide, tantalum oxide, titanium dioxide, cesium oxide, lanthanum oxide, tungsten oxide, yttrium oxide, bismuth silicon oxide ($Bi_4Si_2O_{12}$), barium strontium oxide ($Ba_{1-x}Sr_xO_3$), BST ($Ba_{1-x}Sr_xTiO_3$), PZN ($PbZn_xNb_{1-x}O_3$), PZT ($PbZr_xTi_{1-x}O_3$) and PST ($PbSc_xTa_{1-x}O_3$).

7. The method of claim 1, wherein each one composite dielectric layer comprises at least a portion of the sub-layers of the first dielectric material and the second dielectric material, separated by a sub-layer of a reaction product of the first dielectric material and the second dielectric material.

8. The method of claim 1, wherein each composite dielectric layer comprises a substantially uniform layer of a reaction product of the first dielectric material and the second dielectric material.

9. The method of claim 1, wherein thicknesses of the sub-layers is selected to control ratios of metal to silicon to oxygen in at least one of the composite dielectric layers.

10. A method of making a semiconductor device having a composite dielectric layer, comprising:
    providing a semiconductor substrate;
    depositing on the semiconductor substrate alternating sub-layers of a first dielectric material and a second dielectric material to form a layered dielectric structure having at least two sub-layers of the first dielectric material and at two sub-layers of the second dielectric material,
    wherein the first dielectric material is a standard-K dielectric material and the second dielectric material is a high-K dielectric material, and at least one of dielectric material sub-layers contain nitrogen implanted therein using a nitridation step; and
    annealing the layered dielectric structure at an elevated temperature to form a composite dielectric layer about the boundary of each first dielectric material layer/second dielectric material layer.

11. The method of claim 10, wherein the standard-K dielectric material comprises at least one of silicon dioxide, silicon oxynitride, silicon nitride, and silicon-rich silicon nitride.

12. The method of claim 11, wherein during the step of annealing, the first dielectric material and the second dielectric material form a silicon-containing reaction product in at least one of the composite dielectric layers.

13. The method of claim 11, wherein at least one of the composite dielectric layers comprise a silicate.

14. The method of claim 12, wherein the reaction product comprises a metal atom, a silicon atom and at least one of an oxygen atom or a nitrogen atom.

15. The method of claim 10, wherein the high-K dielectric material comprises at least one of hafnium oxide, zirconium oxide, tantalum oxide, titanium dioxide, cesium oxide, lanthanum oxide, tungsten oxide, yttrium oxide, bismuth silicon oxide ($Bi_4Si_2O_{12}$), barium strontium oxide ($Ba_{1-x}Sr_xO_3$), BST ($Ba_{1-x}Sr_xTiO_3$), PZN ($PbZn_xNb_{1-x}O_3$), PZT ($PbZr_xTi_{1-x}O_3$) and PST ($PbSc_xTa_{1-x}O_3$).

16. The method of claim 10, wherein each one composite dielectric layer comprises at least a portion of the sub-layers of the first dielectric material and the second dielectric material, separated by a sub-layer of a reaction product of the first dielectric material and the second dielectric material.

17. The method of claim 10, wherein each composite dielectric layer comprises a substantially uniform layer of a reaction product of the first dielectric material and the second dielectric material.

18. The method of claim 10, wherein thicknesses of the sub-layers is selected to control ratios of metal to silicon to oxygen in at least one of the composite dielectric layers.

19. The method of claim 10, wherein the at least two dielectric material sub-layers contain nitrogen implanted therein using a nitridation step.

20. A method of making a semiconductor device having a composite dielectric layer, comprising:
    providing a semiconductor substrate;
    subjecting the semiconductor substrate to a nitridation step to produce a layer of standard-K dielectric material in the upper portion of one side of the semiconductor substrate;
    depositing on the standard-K dielectric side of the semiconductor substrate alternating sub-layers of a first dielectric material and a second dielectric material to form a layered dielectric structure having at least one sub-layer of the first dielectric material and at least one sub-layer of the second dielectric material,
    wherein the first dielectric material is a high-K dielectric material and the second dielectric material is a standard-K dielectric material, and at least one of the one or more dielectric material sub-layers contain nitrogen implanted therein using a nitridation step; and
    annealing the layered dielectric structure at an elevated temperature to form a composite dielectric layer about the boundary of each first dielectric material layer/second dielectric material layer.

* * * * *

UNITED STATES PATENT AND TRADEMARK OFFICE
CERTIFICATE OF CORRECTION

| | | |
|---|---|---|
| PATENT NO. | : 6,790,755 B2 | Page 1 of 1 |
| APPLICATION NO. | : 10/034163 | |
| DATED | : September 14, 2004 | |
| INVENTOR(S) | : Jeon | |

It is certified that error appears in the above-identified patent and that said Letters Patent is hereby corrected as shown below:

Column 12, line 11, replace "number co of" with --number $\omega$ of--

Column 12, line 12, replace "layers 110 have" with --layers 110$\omega$ have--

Column 12, line 20, replace "(co=5)" with --($\omega$=5)--

Signed and Sealed this

Nineteenth Day of February, 2008

JON W. DUDAS
*Director of the United States Patent and Trademark Office*